US010741787B2

(12) United States Patent
Su et al.

(10) Patent No.: US 10,741,787 B2
(45) Date of Patent: Aug. 11, 2020

(54) DISPLAY BACK PLATE AND FABRICATING METHOD FOR THE SAME, AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventors: Tongshang Su, Beijing (CN); Dongfang Wang, Beijing (CN); Qinghe Wang, Beijing (CN); Ce Zhao, Beijing (CN); Bin Zhou, Beijing (CN); Liangchen Yan, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/409,419

(22) Filed: May 10, 2019

(65) Prior Publication Data
US 2020/0067012 A1 Feb. 27, 2020

(30) Foreign Application Priority Data
Aug. 21, 2018 (CN) .......................... 2018 1 0954488

(51) Int. Cl.
*H01L 51/52* (2006.01)
*H01L 27/12* (2006.01)

(52) U.S. Cl.
CPC ...... *H01L 51/5237* (2013.01); *H01L 27/1218* (2013.01); *H01L 51/5203* (2013.01)

(58) Field of Classification Search
CPC ............. H01L 51/5237; H01L 27/1218; H01L 51/5203; H01L 23/367; H01L 27/1214;
(Continued)

(56) References Cited

U.S. PATENT DOCUMENTS

2008/0136990 A1* 6/2008 Kimura ............... H01L 27/1218
349/46
2013/0099290 A1* 4/2013 Itoh ................... H01L 21/02532
257/225

(Continued)

FOREIGN PATENT DOCUMENTS

| CN | 101154346 | 4/2008 |
| CN | 105428332 | 3/2016 |

(Continued)

OTHER PUBLICATIONS

1st Office Action dated Mar. 17, 2020 for Chinese Patent Application No. 201810954488.X.

(Continued)

*Primary Examiner* — Stacy Khoo
(74) *Attorney, Agent, or Firm* — Thomas | Horstemeyer LLP

(57) ABSTRACT

A display back plate, a fabricating method for the same, and a display device are provided. The display back plate includes a substrate, a transparent heat conduction layer disposed on the substrate, and an array structure layer disposed on the heat conduction layer. The array structure layer includes a light shielding layer, a first thin film transistor, and a second thin film transistor, where the light shielding layer is disposed between the transparent heat conduction layer and the first thin film transistor.

9 Claims, 5 Drawing Sheets

(58) Field of Classification Search
CPC ............. H01L 27/1259; H01L 27/1262; H01L 27/3244; H01L 27/3272; H01L 29/78633; H01L 51/529; H01L 27/3262
See application file for complete search history.

(56) References Cited

U.S. PATENT DOCUMENTS

| | | |
|---|---|---|
| 2015/0014635 A1 | 1/2015 | Noh |
| 2015/0021607 A1 | 1/2015 | Yoon et al. |
| 2016/0035800 A1* | 2/2016 | Hsieh ................. H01L 51/5253 257/40 |
| 2017/0294456 A1* | 10/2017 | Lee ................... H01L 21/02565 |
| 2017/0307921 A1* | 10/2017 | Feng ..................... G02F 1/1343 |
| 2018/0197884 A1* | 7/2018 | Hayashi ............ H01L 21/76802 |
| 2019/0035825 A1* | 1/2019 | Huang .............. H01L 29/78621 |

FOREIGN PATENT DOCUMENTS

| | | |
|---|---|---|
| CN | 107634068 | 1/2018 |
| CN | 107665951 | 2/2018 |
| CN | 107680993 | 2/2018 |

OTHER PUBLICATIONS

2nd Office Action dated May 29, 2020 for Chinese Patent Application No. 201810954488.X.

* cited by examiner

DISPLAY BACK PLATE AND FABRICATING METHOD FOR THE SAME, AND DISPLAY DEVICE

CROSS-REFERENCE TO RELATED APPLICATIONS

The present application is based on and claims priority to Chinese Patent Application No. 201810954488.X, filed on Aug. 21, 2018, the entire contents of which are incorporated herein by reference.

TECHNICAL FIELD

The present disclosure relates to the field of display technologies and, in particular, to a display back plate, a method fabricating for the same, and a display device.

BACKGROUND

A thin film transistor (TFT) is a very important component in the technical field of display, and plays a very important role in liquid crystal display (LCD) and organic light emitting diode (OLED) devices. Presently, there are two main types of thin film transistors: bottom-gate thin film transistors and top-gate thin film transistors. Since there is no overlapping region between the gate electrode and the source/drain electrode in the top-gate thin film transistor, the stray capacitance is small and the small stray capacitance reduces the delay of the RC circuit, so that it has a higher switching speed and it is easier to achieve higher resolution display. At the same time, the number of patterning processes required for fabricating the top-gate type thin film transistor is small, and the fabricating process is simple. Therefore, top-gate thin film transistors are widely used in high-resolution OLED display devices.

In an OLED display device using the top-gate type thin film transistor, there is a problem that characteristics of driving thin film transistor and switching thin film transistor are separated, which directly affects the display effect of the OLED display device.

SUMMARY

The technical problem to be solved by the embodiments of the present disclosure is to provide a display back plate, a fabricating method thereof, and a display device so as to overcome the problem that characteristics of driving thin film transistor and switching thin film transistor are separated of the OLED display device in the related art.

In order to solve the above technical problem, an embodiment of the present disclosure provides a display back plate including: a substrate, a transparent heat conduction layer disposed on the substrate, and an array structure layer disposed on the heat conduction layer. The array structure layer includes a light shielding layer, a first thin film transistor, and a second thin film transistor. The light shielding layer is disposed between the transparent heat conduction layer and the first thin film transistor.

Optionally, the transparent heat conduction layer includes at least one of a transparent conductive layer and a transparent semiconductor layer.

Optionally, the transparent heat conduction layer includes a transparent conductive layer and a first buffer layer.

Optionally, the transparent heat conduction layer includes a transparent semiconductor layer and a first buffer layer.

Optionally, the transparent heat conduction layer includes a transparent conductive layer, a transparent semiconductor layer, and a first buffer layer.

Optionally, the transparent conductive layer has a thickness of 150 Å to 1500 Å, or the transparent semiconductor layer has a thickness of 150 Å to 1500 Å, or the transparent conductive layer and the transparent semiconductor layer have a thickness of 300 Å to 3,000 Å.

Optionally, a material of the transparent conductive layer includes indium tin oxide or indium zinc oxide, and a material of the transparent semiconductor layer includes a metal oxide or a silicon material, and the metal oxide includes indium gallium zinc oxide or indium tin zinc oxide.

Optionally, the array structure layer includes:
a light shielding layer formed on the transparent heat conduction layer;
a second buffer layer covering the light shielding layer; a first active layer and a second active layer formed on the second buffer layer, a position of the first active layer corresponding to a position of the light shielding layer;
a first gate insulating layer and a first gate electrode formed on the first active layer, a second gate insulating layer and a second gate electrode formed on the second active layer;
an interlayer insulating layer covering the first gate electrode and the second gate electrode;
a first source electrode, a first drain electrode, a second source electrode, and a second drain electrode formed on the interlayer insulating layer, the first source electrode and the first drain electrode respectively being connected with the first active layer through via holes disposed on the interlayer insulating layer, and the second source electrode and the second drain electrode being respectively connected with the second active layer through via holes disposed on the interlayer insulating layer;
a passivation layer covering the first source electrode, the first drain electrode, the second source electrode, and the second drain electrode.

Embodiments of the present disclosure also provide a display device including the aforementioned display back plate.

In order to solve the above technical problem, an embodiment of the present disclosure further provides a fabricating method for a display back plate, which includes:
forming a transparent heat conduction layer on a substrate; and
forming an array structure layer on the transparent heat conduction layer, the array structure layer comprises a light shielding layer, a first thin film transistor, and a second thin film transistor, and the light shielding layer is formed between the transparent heat conduction layer and the first thin film transistor.

Optionally, forming a transparent heat conduction layer on the substrate includes: forming at least one of a transparent conductive layer and a transparent semiconductor layer on the substrate.

Optionally, forming a transparent heat conduction layer on the substrate includes: forming a transparent conductive layer and a first buffer layer on the substrate.

Optionally, forming a transparent heat conduction layer on the substrate includes: forming a transparent semiconductor layer and a first buffer layer on the substrate.

Optionally, forming a transparent heat conduction layer on the substrate includes: forming a transparent conductive layer, a transparent semiconductor layer, and a first buffer layer on the substrate.

Optionally, the transparent conductive layer has a thickness of 150 Å to 1500 Å, or the transparent semiconductor layer has a thickness of 150 Å to 1500 Å, or the transparent conductive layer and the transparent semiconductor layer have a thickness of 300 Å to 3,000 Å.

Optionally, a material of the transparent conductive layer includes indium tin oxide or indium zinc oxide, and a material of the transparent semiconductor layer includes a metal oxide or a silicon material, and the metal oxide includes indium gallium zinc oxide or indium tin zinc oxide.

Optionally, forming an array structure layer on the transparent heat conduction layer includes:

forming the light shielding layer when the transparent heat conduction layer is formed on the substrate;

sequentially depositing a second buffer layer and an active layer thin film, forming a first active layer and a second active layer on the second buffer layer by patterning process, a position of the first active layer corresponding to a position of the light shielding layer;

sequentially forming a gate insulating thin film and a gate metal thin film, forming a first gate insulating layer and a first gate electrode on the first active layer by patterning process, forming a second gate insulating layer and a second gate electrode on the second active layer;

ion doping a region in which the first active layer is not blocked by the first gate electrode, and ion doping the region in which the second active layer is not blocked by the second gate electrode, forming doped regions of the first active layer and the second active layer;

depositing an interlayer insulating thin film, forming via holes by patterning process, the via holes being respectively located in the doped region of the first active layer and the doped region of the second active layer;

depositing a source/drain metal thin film, forming a first source electrode, a first drain electrode, a second source electrode and a second drain electrode by patterning process, the first source electrode and the first drain electrode being respectively connected with the doped region of the first active layer through the via hole, and the second source electrode and the second drain electrode being respectively connected with the doped region of the second active layer through the via hole; and forming a passivation layer covering the first source electrode, the first drain electrode, the second source electrode, and the second drain electrode.

BRIEF DESCRIPTION OF THE DRAWINGS

The drawings are used to provide a further understanding of the technical solutions of the present disclosure, and constitute part of the specification. These drawings together with the embodiments of the present application are used to explain the technical solutions of the present disclosure, and do not constitute a limitation of the technical solutions of the present disclosure. The shapes and sizes of various components in the drawings do not reflect true proportions, and are merely intended to illustrate the present disclosure.

DETAILED DESCRIPTION

Figure 1:
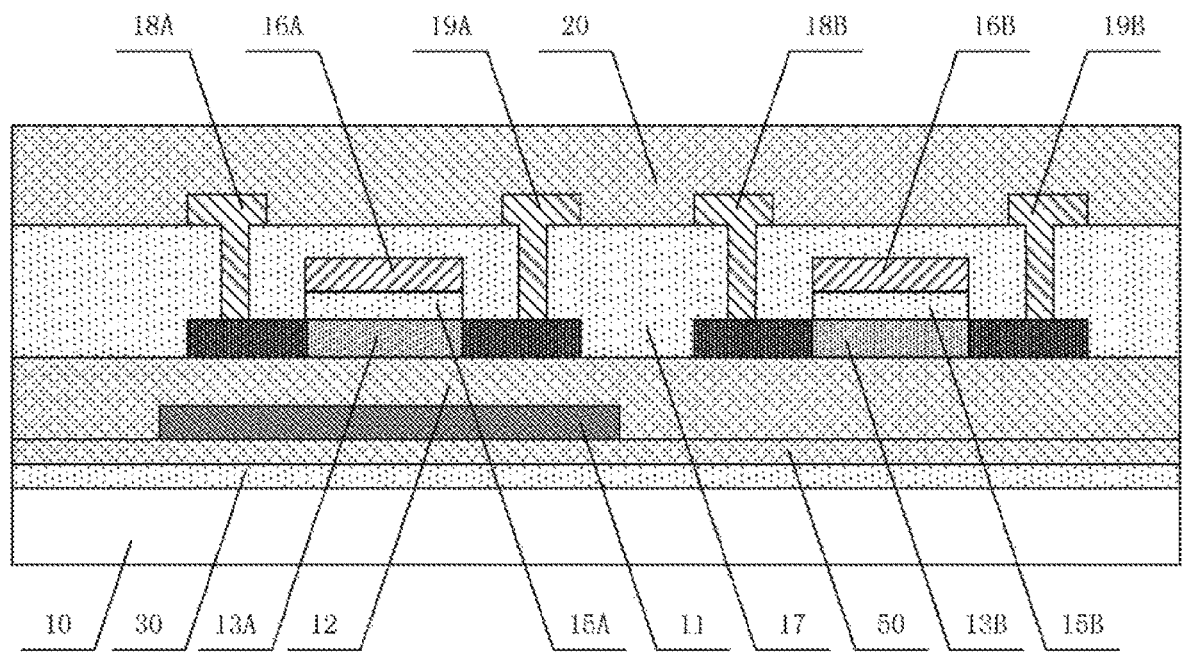
FIG. 1 is a schematic structural view of a first embodiment of a back plate according to the present disclosure.

The specific embodiments of the present disclosure are further described in detail below with reference to the accompanying drawings and embodiments. The following embodiments are intended to illustrate the present disclosure, but are not intended to limit the scope of the present disclosure. It should be noted that the features in the embodiments and the embodiments in the present application may be arbitrarily combined with each other without conflict.

A driving thin film transistor and a switching thin film transistor are separated from the OLED display device in the related art, which is caused during fabrication of the display back plate. Presently, the display back plate of the OLED display device in the related art generally adopts two thin film transistors and a capacitor 2T1C pixel driving circuit. In these two film transistors, one is a switching thin film transistor (Switching TFT), and the other is a driving thin film transistor (Driving TFT). When the scanning line is turned on, a certain voltage is applied to the gate electrode of the switching TFT, and a voltage signal is transmitted to the driving TFT to conduct the driving TFT and, at the same time, the capacitor is charged. When the scanning line is turned off, the voltage stored in the capacitor may enable the driving TFT to remain in a conducted state, so that the fixed current may be maintained in one frame for display. The thin film transistor has a very high requirement for illumination stability and light for the thin film transistor may affect its electrical characteristics, so it is necessary to provide a light shielding layer at a corresponding position of the thin film transistor. For the top gate bottom emission structure, the display back plate is exposed to the light environment, and light is emitted from a surface of the substrate to the thin film transistor. Therefore, it is necessary to provide a light shielding layer between the substrate and the thin film transistor, and the light shielding layer is generally made of a metal material. Presently, a light shielding layer is disposed under both thin film transistors, which may seriously reduce the aperture ratio of the OLED display device, so a structure of the related art only provides a light shielding layer under the driving thin film transistor. Since the light shielding layer is made of metal material with a large thermal conductivity, in the process of fabricating two thin film transistors after the light shielding layer is formed, the heat effect generated by the driving thin film transistor is greater than that of the switching thin film transistor in the subsequent high temperature process, such that a conducting degree of the active layer in the driving thin film transistor is more severe than that of the switching thin film transistor, and the negative-direction offset of the threshold voltage Vth of the driving thin film transistor is larger than that of the switching thin film transistor, thereby causing electrical characteristics of the two thin film transistors to be different, i.e., there is a problem in that characteristics of the driving thin film transistor and the switching thin film transistor are separated.

An embodiment of the present disclosure provides a display back plate including: a substrate, a transparent heat conduction layer disposed on the substrate, and an array structure layer disposed on the heat conduction layer. The array structure layer includes a first thin film transistor as a driving thin film transistor and a second thin film transistor as a switching thin film transistor, which are disposed on the transparent heat conduction layer, and a light shielding layer is disposed between the transparent heat conduction layer and the first thin film transistor.

In the embodiment of the present disclosure, the transparent heat conduction layer is used to apply a balanced heat effect to the first thin film transistor and the second thin film transistor in the subsequently high temperature process for fabricating the array structure layer, so as to reduce the difference between heat effects of the two thin film transistors, increase the uniformity of the threshold voltage Vth of the two thin film transistors, and minimize the problem of separating characteristics of the driving thin film transistor and the switching thin film transistor. On the other hand, with a good heat dissipation function of the transparent heat conduction layer, the thermal stress acting on the two thin film transistors can be reduced during fabrication and operation to ensure the electrical characteristics of two thin film transistors, and to improve the working performance of the display back plate.

In an embodiment, the transparent heat conduction layer includes a transparent conductive layer and a first buffer layer.

In another embodiment, the transparent heat conduction layer includes a transparent semiconductor layer and a first buffer layer.

In yet another embodiment, the transparent heat conduction layer includes a transparent conductive layer, a transparent semiconductor layer, and a first buffer layer.

In the display back plate provided by the embodiment of the present disclosure, the problem of the separating characteristics of the driving thin film transistor and the switching thin film transistor present in the existing OLED display device can be effectively solved by providing a transparent heat conduction layer between the substrate and the array structure layer. Specifically, in the high-temperature process for fabricating the array structure layer, the transparent heat conduction layer may apply a balanced heat effect to two thin film transistors, reduce the difference between heat effects of two thin film transistors, increase uniformity of the threshold voltage Vth of two thin film transistors, minimize separation of characteristics of the driving thin film transistor and the switching thin film transistor, and, at the same time, reduce the thermal stress acting on the two thin film transistors during the fabricating process by providing a good heat dissipation function of the transparent heat conduction layer, so as to ensure electrical properties of these two thin film transistors. Further, the transparent heat conduction layer may also improve the heat dissipation efficiency during the operation of the OLED display device, improve the working stability and reliability of the OLED display device, and improve the working performance of the display back plate.

The technical solutions of the embodiments of the present disclosure are described in detail below through specific embodiments.

First Embodiment

FIG. 1 is a schematic structural view of a first embodiment of a back plate of the present disclosure, showing only a portion of a driving thin film transistor and a switching thin film transistor. As shown in FIG. 1, a body structure of the top gate bottom emission structure OLED display back plate of the present embodiment includes a transparent heat conduction layer formed on the substrate, a shielding layer, a top gate type first thin film transistor, and a top gate type second thin film transistor formed on the transparent heat conduction layer. The transparent heat conduction layer includes a transparent conductive layer and a first buffer layer, the first thin film transistor serves as a driving thin film transistor (DR TFT), and the second thin film transistor serves as a switching thin film transistor (SW TFT). Specifically, the back plate of the present embodiment includes: a transparent conductive layer 30 and a first buffer layer 50 sequentially formed on the substrate 10; a light shielding layer 11 formed on the first buffer layer 50; a second buffer layer 12 covering the light shielding layer 11; a first active layer 13A and a second active layer 13B formed on the second buffer layer 12, a position of the first active layer 13A corresponding to a position of the light shielding layer 11; a first gate insulating layer 15A and a first gate electrode 16A formed on the first active layer 13A; a second gate insulating layer 15B and a second gate electrode 16B formed on the second active layer 13B; an interlayer insulating layer 17 covering the first gate electrode 16A, the second gate electrode 16B, the first active layer 13A and the second active layer 13B; a first source electrode 18A, a first drain electrode 19A, a second source electrode 18B and second drain electrode 19B formed on the interlayer insulating layer 17, the first source electrode 18A and the first drain electrode 19A being respectively connected with the first active layer 13A through via holes formed on the interlayer insulating layer 17, and the second source electrode 18B and the second drain electrode 19B being respectively connected with the second active layer 13B through via holes formed on the interlayer insulating layer 17; a passivation layer 20 covering the first source electrode 18A, the first drain electrode 19A, the second source electrode 18B and the second drain electrode 19B. The first active layer 13A, the first gate electrode 16A, the first source electrode 18A, and the first drain electrode 19A form a first thin film transistor as a driving thin film transistor, and the second active layer 13B, the second gate electrode 16B, the second source electrode 18B and the second drain electrode 19B form a second thin film transistor as a switching thin film transistor.

In this embodiment, the transparent conductive layer 30 and the first buffer layer 50 serve as a transparent heat conduction layer. A material of the transparent conductive layer may be indium tin oxide ITO or indium zinc oxide IZO, and a thickness thereof is 150 Å to 1500 Å. A material of the first buffer layer may be such as silicon oxide (SiOx), silicon nitride (SiNx), silicon oxynitride (SiON), or a combination of the above materials, and may be a combination of a single layer, a double layer, a multilayer layer or a composite layer.

The technical solution of the embodiment of the present disclosure will be further described below by the fabricating process of the display back plate. The "patterning process" in the present embodiment includes a process of depositing a film layer, coating a photoresist, mask exposure, development, etching, stripping photoresist, etc., and is a mature fabricating process in the related art. The deposition may be carried out by a known process such as sputtering, evaporation, chemical vapor deposition, or the like. The coating may be carried out by a known coating process, and the etching may be carried out by a known method, which is not specifically limited herein.

Figure 2:
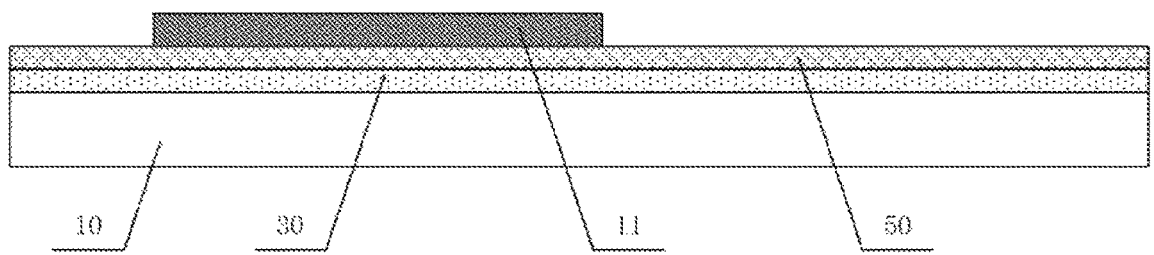
FIG. 2 is a schematic view of the first embodiment of the present disclosure after forming a light shielding layer pattern.

First, a light shielding layer pattern is formed on a substrate. Forming the light shielding layer pattern includes: sequentially depositing a transparent conductive material thin film, a buffer layer thin film, and a light shielding thin film on the substrate 10; coating a layer of photoresist on the light shielding thin film, exposing and developing the photoresist by using a monotone mask, forming an unexposed area, and retaining the photoresist at a position of the light shielding layer pattern, forming a completely exposed area at other positions with removing the photoresist and exposing the light shielding thin film; etching the light shielding thin film exposed out of the completely exposed area and stripping the remaining photoresist to form patterns of the transparent conductive layer 30, the first buffer layer 50 and the light shielding layer 11 on the substrate 10, as shown in FIG. 2. The substrate may be a glass substrate, a quartz substrate, or a flexible material substrate. The transparent conductive material thin film may be indium tin oxide ITO or indium zinc oxide IZO, and the deposition thickness thereof is 150 Å to 1500 Å. The buffer layer thin film may be silicon oxide (SiOx), silicon nitride (SiNx), silicon oxynitride (SiON), or a combination thereof, and the light shielding thin film may be one of metals such as silver Ag, molybdenum Mo, aluminum Al, copper Cu or the like, or a composite layer structure of a plurality of metals, such as Mo/Cu/Mo.

Figure 3:
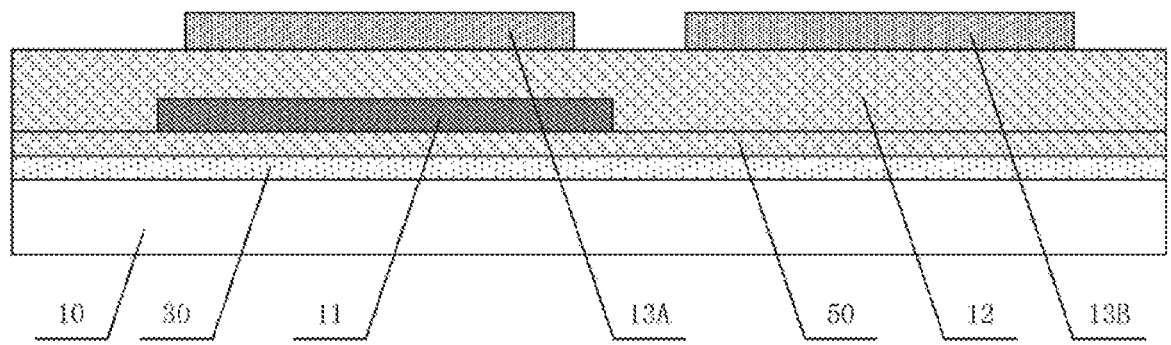
FIG. 3 is a schematic view of the first embodiment of the present disclosure after forming an active layer pattern.

Subsequently, an active layer pattern is formed. Forming the active layer pattern includes: sequentially depositing a buffer layer thin film and an active layer thin film on the substrate on which the foregoing pattern is formed; coating a layer of photoresist on the active layer thin film, exposing and developing the photoresist by using a monotone mask, forming an unexposed area and retaining the photoresist at a position of the active layer pattern, forming a completely exposed area at other positions with removing the photoresist; etching the active layer thin film in the completely exposed area and stripping the remaining photoresist to form patterns of the second buffer layer 12, the first active layer 13A and the second active layer 13B, a position of the first active layer 13A corresponding to a position of the light shielding layer 11, as shown in FIG. 3. The second buffer layer is used to block the influence of ions in the substrate on the thin film transistor, and a composite thin film of silicon nitride SiNx, silicon oxide SiOx or SiNx/SiOx may be used. The active layer thin film may be metal oxide or silicon material, wherein the metal oxide includes indium gallium zinc oxide (IGZO) or indium tin zinc oxide (ITZO), and the silicon material includes amorphous silicon and polycrystalline silicon. The active layer thin film may also be formed of amorphous silicon a-Si by crystallization or laser annealing, for example.

Figure 4:
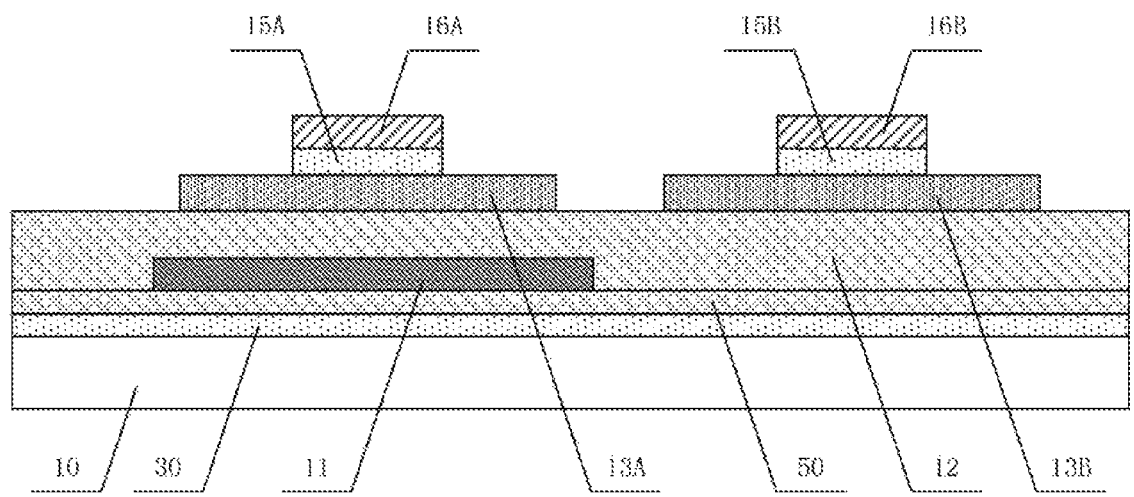
FIG. 4 is a schematic view of the first embodiment of the present disclosure after forming a gate electrode pattern.

Subsequently, a gate electrode pattern is formed. Forming the gate electrode pattern includes: sequentially depositing a gate insulating thin film and a gate metal thin film on the substrate on which the foregoing pattern is formed, patterning the gate insulating thin film and the gate metal thin film by a patterning process, forming the stacked first gate insulating layer 15A and first gate electrode 16A on the first active layer 13A, and forming the stacked second gate insulating layer 15B and second gate electrode 16B on the second active layer 13B, as shown in FIG. 4. Since it is formed by the patterning process once, patterns of the first gate insulating layer 15A and the first gate electrode 16A are the same, and patterns of the second gate insulating layer 15B and the second gate electrode 16B are the same, and are located at the middle portion of the corresponding active layer pattern. The gate metal thin film may be one or more of metals such as platinum Pt, ruthenium Ru, gold Au, silver Ag, molybdenum Mo, chromium Cr, aluminum Al, tantalum Ta, titanium Ti, tungsten W or the like, or may be a composite layer structure of a plurality of metals, and the gate insulating thin film may be made of SiOx, SiNx, SiON, or a combination thereof.

Figure 5:
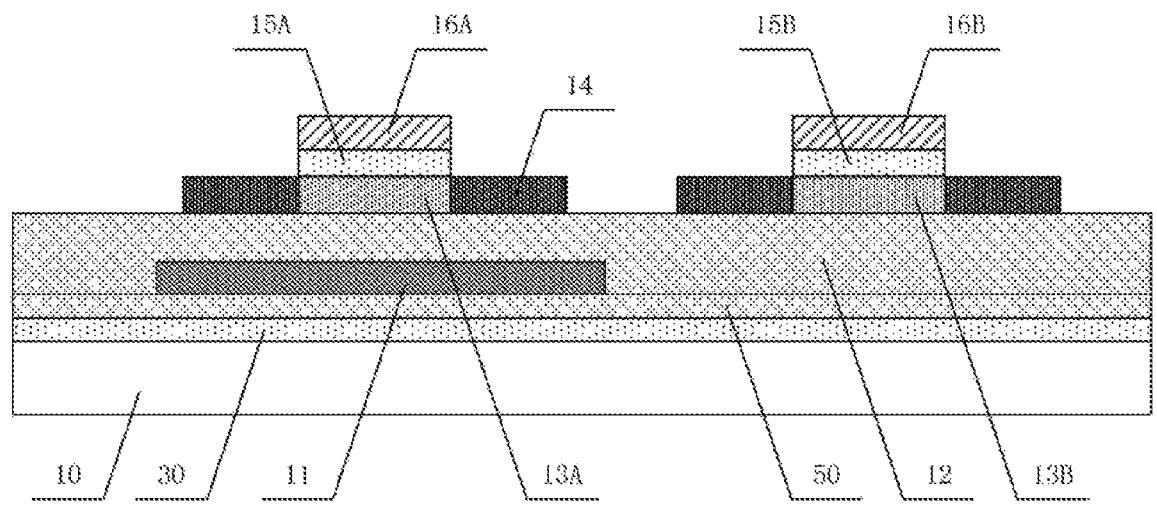
FIG. 5 is a schematic view of the first embodiment of the present disclosure after forming a doped region pattern.

Subsequently, a doped region pattern of the active layer is formed. Forming the doped region pattern of the active layer includes: ion doping a region in which the first active layer 13A is not blocked by the first gate electrode 16A, and ion doping a region in which the second active layer 13B is not blocked by the second gate electrode 16B so as to form patterns of doped regions 14 of the first active layer and the second active layer, as shown in FIG. 5. In the ion doping process, due to the double blocking of the gate insulating layer and the gate electrode, the influence of the doping ions on the channel region can be avoided. After the ion doping treatment, the active layer outside the channel region becomes a metal.

Figure 6:
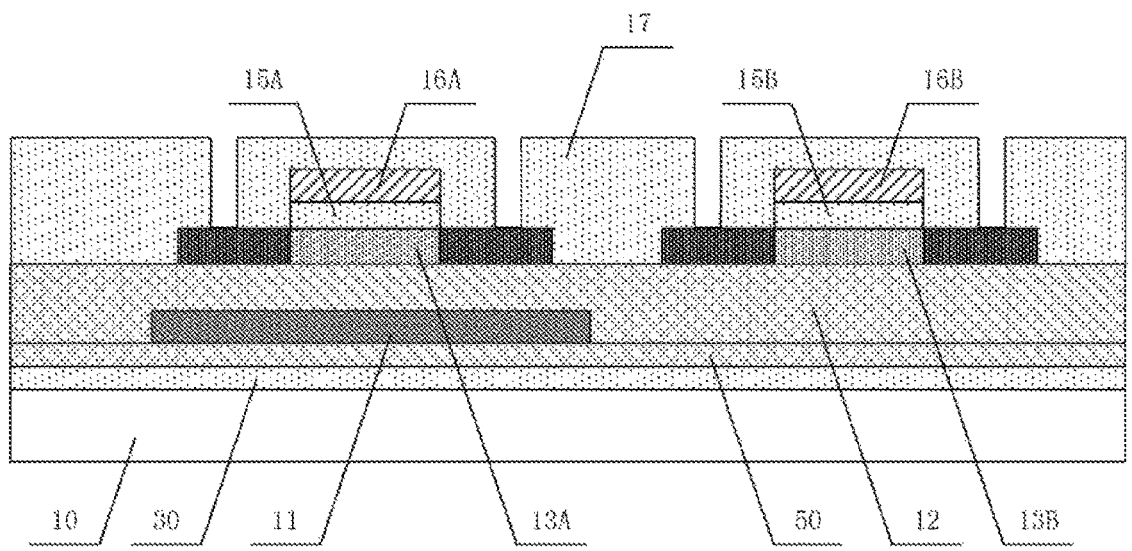
FIG. 6 is a schematic view of the first embodiment of the present disclosure after forming an interlayer insulating layer pattern.

Subsequently, an interlayer insulating layer pattern is formed. Forming the interlayer insulating layer pattern includes: depositing an interlayer insulating thin film on the substrate on which the foregoing pattern is formed; coating a layer of photoresist on the interlayer insulating thin film, exposing and developing the photoresist by using a monotone mask, forming a completely exposed area at a position of the via hole pattern, removing the photoresist, forming an unexposed area at other locations, retaining the photoresist; etching the interlayer insulating thin film exposed out of the completely exposed area and stripping the remaining the photoresist to form a pattern of interlayer insulating layers 17 provided with via holes, which via holes are respectively located in the doped region of the first active layer 13A and the doped region of the second active layer 13B, as shown in FIG. 6. The interlayer insulating thin film may be SiOx, SiNx, SiON, or a combination thereof.

Figure 7:
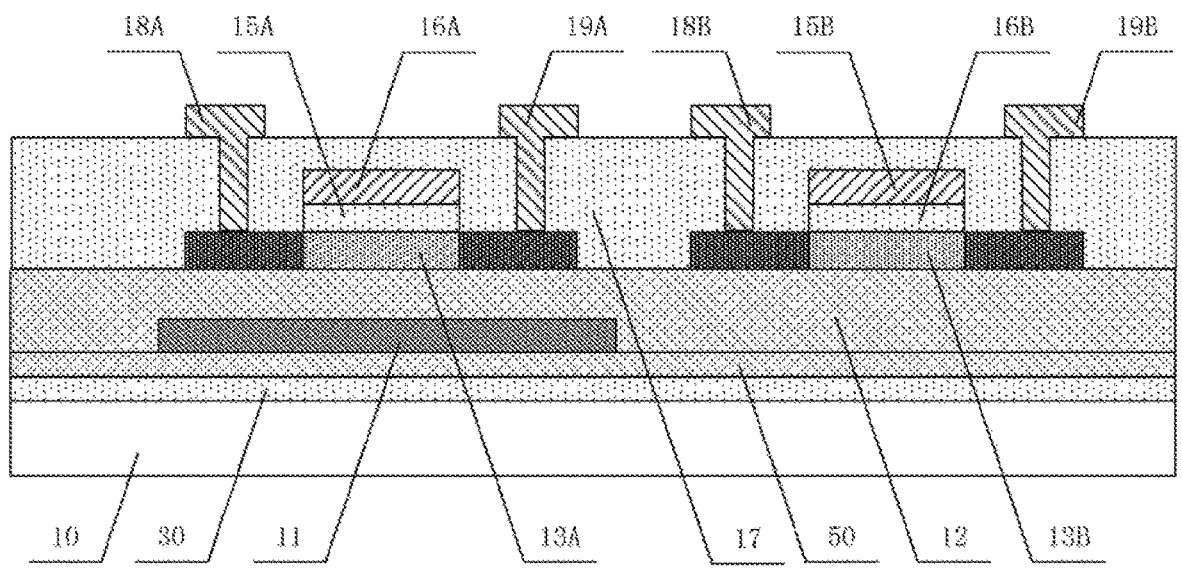
FIG. 7 is a schematic view of the first embodiment of the present disclosure after forming a source electrode pattern and a drain electrode pattern.

Subsequently, source and drain electrode patterns are formed. Forming source and drain electrodes pattern includes: depositing a source/drain metal thin film on the substrate on which the pattern is formed, patterning the source/drain metal thin film by a patterning process, forming the first source electrode 18A, the first drain electrode 19A, the second source electrode 18B, and the second drain electrode 19B, in which the first source electrode 18A and the first drain electrode 19A are respectively connected with the doping region of the first active layer 13A through via holes formed in the interlayer insulating layer 17, and in which the second source electrode 18B and the second drain electrode 19B are respectively connected with the doped region of the second active layer 13B through via holes formed in the interlayer insulating layer 17, as shown in FIG. 7. The source/drain metal thin film may be one or more of metals such as platinum Pt, ruthenium Ru, gold Au, silver Ag, molybdenum Mo, chromium Cr, aluminum Al, tantalum Ta, titanium Ti, tungsten W or the like, or may be a composite layer structure of a plurality of metals.

Subsequently, a passivation layer 20 is deposited on the substrate on which the foregoing pattern is formed, and the passivation layer 20 covers the first source electrode 18A, the first drain electrode 19A, the second source electrode 18B, and the second drain electrode 19B, as shown in FIG. 1. The passivation layer may be SiOx, SiNx, SiON, or a combination thereof.

In an actual implementation, the embodiment may further include the subsequent step of forming a light-emitting structure layer, which light-emitting structure layer includes a structural film layer such as a flat layer (PLN), an anode, a pixel defining layer (PDL), a light-emitting layer, a cathode, and an encapsulation layer. The structure and fabricating means of the light-emitting structure layer are the same as those of the related art, and are not repeated herein.

In the display back plate provided by this embodiment, since the transparent conductive layer has good thermal conductivity, the transparent conductive layer may always maintain a uniform temperature during the high-temperature process of fabricating the array structure layer and the light-emitting structure layer, and may always apply a balanced heat effect to the first thin film transistor and the second thin film transistor, thereby maximally eliminating the difference between heat effects of the first thin film transistor and the second thin film transistor, and thus ensuring the uniformity of the threshold voltage Vth of the first thin film transistor and the second thin film transistor. Further, the transparent conductive layer covering the entire substrate and having good thermal conductivity can not only provide a good heat dissipation function in the fabricating process, but also can improve the heat dissipation efficiency during the operation of the OLED display device, so as to improve the working stability and reliability of the OLED display device. In addition, since the first buffer layer is disposed on the transparent conductive layer, the first buffer layer has a good thermal insulation performance, and the thermal stress applied to the first thin film transistor and the second thin film transistor can be reduced, so as to reduce the drifting of the threshold voltage Vth of the thin film transistor and improve the electrical characteristics of thin film transistors.

Second Embodiment

Figure 8:
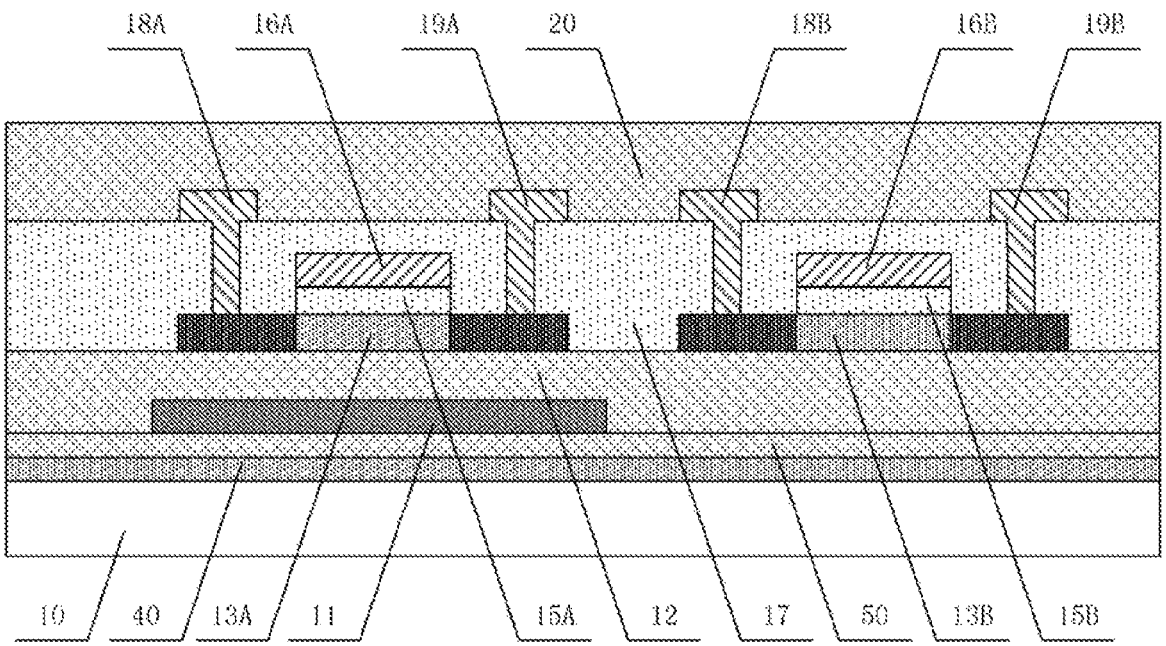
FIG. 8 is a schematic structural view of a second embodiment of a back plate according to the present disclosure.

FIG. 8 is a schematic structural view of a second embodiment of the back plate according to the present disclosure. This embodiment is an extension of the foregoing first embodiment. The body structure of the top gate bottom emission structure OLED display back plate includes a transparent heat conduction layer formed on the substrate, a shielding layer a top gate type first thin film transistor and a top gate type second thin film transistor formed on the transparent heat conduction layer. Different from the foregoing first embodiment, the transparent heat conduction layer of the present embodiment includes a transparent semiconductor layer 40 and a first buffer layer 50, as shown in FIG. 8.

In this embodiment, a material of the transparent semiconductor layer may be metal oxide or silicon material. The metal oxide may include a metal oxide semiconductor formed by one or more of metal elements such as indium (In) or gallium (Ga), such as Indium gallium zinc oxide (IGZO), indium tin zinc oxide (ITZO), etc., and the silicon material may include amorphous silicon and polycrystalline silicon, and has a thickness of 150 Å to 1500 Å. The structure of the other thin film layers of the present embodiment and the materials thereof are the same as those of the first embodiment described above, and the fabricating process is basically the same as that of the first embodiment, except that in the process of forming the light shielding layer pattern, the transparent semiconductor layer thin film, the buffer layer thin film, and the light shielding thin film are sequentially deposited on the substrate.

In this embodiment, a transparent semiconductor layer is used as the transparent heat conduction layer, and characteristics of the semiconductor can be utilized to absorb or filter ions with high energy in the ambient light during the operation of the OLED display device, increase the illumination stability, and eliminate the influence of illumination on the electrical properties of the first thin film transistor and the second thin film transistor. In addition, the thermal conductivity of the transparent semiconductor layer is smaller than that of the shielding layer, however, since an area of the transparent semiconductor layer formed on the substrate is much larger than that of the shielding layer, the difference between heat effects of the first thin film transistor and the second thin film transistor can be eliminated to some extent, and the uniformity of the threshold voltage Vth of the first thin film transistor and the second thin film transistor can be achieved to some extent. Therefore, the technical solution of the embodiment can not only solve the problem of separating the characteristics of the driving thin film transistor and the switching thin film transistor, but also improve the heat dissipation efficiency in the operation of the OLED display device, and can maximally increase the illumination stability and improve the working stability and working performance of the OLED display device.

Third Embodiment

Figure 9:
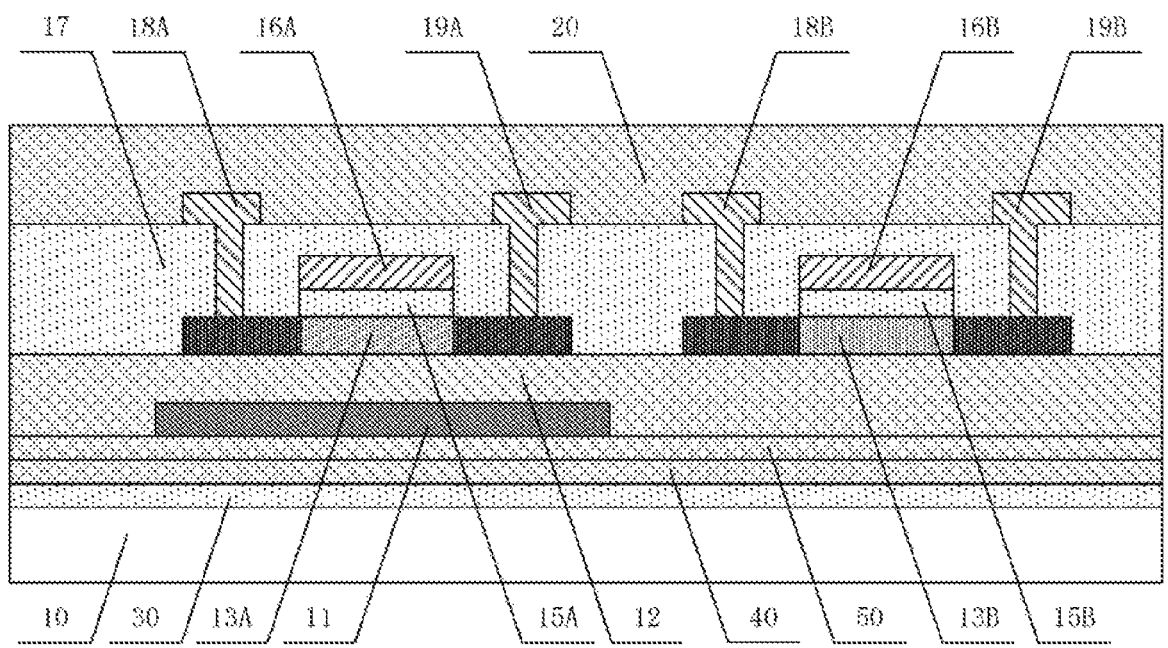
FIG. 9 is a schematic structural view of a third embodiment of a back plate according to the present disclosure.

FIG. 9 is a schematic structural view of a third embodiment of the back plate according to the present disclosure. This embodiment is an extension of the foregoing first and second embodiments. The body structure of the top gate bottom emission structure OLED display back plate includes a transparent heat conduction layer formed on the substrate, a shielding layer, a top gate type first thin film transistor and a top gate type second thin film transistor formed on the transparent heat conduction layer. Different from the foregoing first and second embodiments, the transparent heat conduction layer of the present embodiment includes a transparent conductive layer 30, a transparent semiconductor layer 40, and a first buffer layer 50, as shown in FIG. 9.

In this embodiment, a material of the transparent conductive layer may be indium tin oxide ITO or indium zinc oxide IZO. A material of the transparent semiconductor layer may be metal oxide or silicon material, in which the metal oxide may include a metal oxide semiconductor formed by one or more of metal elements such as indium (In) or gallium (Ga), such as indium gallium zinc oxide (IGZO), indium tin zinc oxide (ITZO), etc., and the silicon material may include amorphous silicon and polycrystalline silicon. The total thickness of the transparent conductive layer and the transparent semiconductor layer is from 300 Å to 3,000 Å. The structure of the other thin film layers of the embodiment and the materials thereof are the same as those of the first and second embodiments described above, and the fabricating process is basically the same, except that in the process of forming the light shielding layer pattern, a transparent conductive material thin film, a transparent semiconductor layer thin film, a buffer layer thin film, and a light shielding thin film are sequentially deposited on the substrate.

In actual implementation, the positional relationship between the transparent conductive layer and the transparent semiconductor layer may be a structure in which the transparent conductive layer is lower and the transparent semiconductor layer is higher, or a structure in which the transparent semiconductor layer is lower and transparent conductive layer is higher. Other structures may also be used, for example, the transparent semiconductor layer may be disposed between two transparent conductive layers or the transparent conductive layer may be disposed between two transparent semiconductor layers, etc., and the disclosure is not specifically limited herein.

In this embodiment, the transparent conductive layer and the transparent semiconductor layer are used together as a transparent heat conduction layer. On one hand, the transparent conductive layer may be used to maximally eliminate the difference between heat effects of the first thin film transistor and the second thin film transistor, and ensure the uniformity of the threshold voltage Vth of two thin film transistors. On the other hand, the transparent semiconductor layer may be used to maximally increase the illumination stability and improve the working stability and working performance of the OLED display device. Specifically, by providing a transparent conductive layer having good thermal conductivity, the transparent conductive layer can always maintain a uniform temperature during the high-temperature process for subsequently fabricating the array structure layer and the light-emitting structure layer, and apply a balanced heat effect to the two thin film transistors, so that the difference between heat effects of the two thin film transistors may be maximally eliminated and the uniformity of the threshold voltage Vth of the two thin film transistors may be ensured. The transparent conductive layer with good thermal conductivity can not only provide good heat dissipation function in the fabricating process, but also can improve the heat dissipation efficiency in the working process of the OLED display device. At the same time, by providing a transparent oxide material layer with semiconductor characteristics, when the OLED display device is in operation, the transparent semiconductor layer can absorb or filter ions with high energy in the ambient light, increase the illumination stability, and eliminate the influence of the illumination on the electrical characteristics of two thin film transistors. In addition, by providing the first buffer layer having good heat insulating properties, the thermal stress applied to the two thin film transistors can be reduced, the drifting of the threshold voltage Vth of the thin film transistor can be reduced, and the electrical characteristics of the thin film transistor can be improved. Therefore, the technical solution of the embodiment can not only maximally eliminate the deviation of the threshold voltage Vth of two thin film transistors, but also maximally increase the illumination stability and improve the reliability, stability, and electrical characteristics of the OLED display device.

Fourth Embodiment

Figure 10:
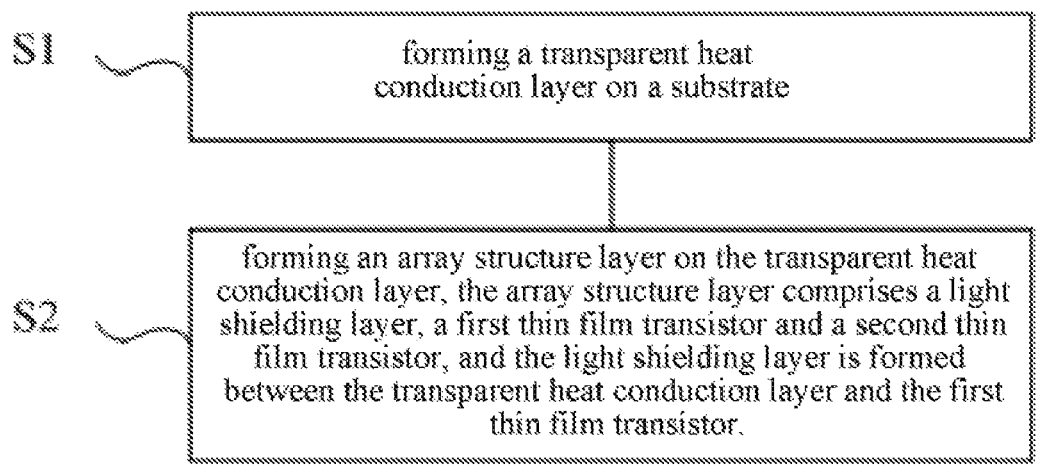
FIG. 10 is a flow chart of a fabricating method for a back plate according to an embodiment of the present disclosure.

Based on the technical idea of the present disclosure, an embodiment of the present disclosure further provides a fabricating method of a display back plate. FIG. 10 is a flowchart of a fabricating method of a display back plate according to an embodiment of the present disclosure. As shown in FIG. 10, a fabricating method of a display back plate includes:

S1: forming a transparent heat conduction layer on the substrate;

S2: forming an array structure layer on the transparent heat conduction layer, the array structure layer including a light shielding layer, a first thin film transistor and a second thin film transistor, wherein the light shielding layer is formed between the transparent heat conduction layer and the first thin film transistor.

In one embodiment, the step S1 includes forming a transparent conductive layer and a first buffer layer on the substrate.

In another embodiment, the step S1 includes forming a transparent semiconductor layer and a first buffer layer on the substrate.

In still another embodiment, the step S1 includes forming a transparent conductive layer, a transparent semiconductor layer, and a first buffer layer on the substrate.

The transparent conductive layer has a thickness of 150 Å to 1500 Å, for example, 500 Å, 1000 Å, or the transparent semiconductor layer has a thickness of 150 Å to 1500 Å, for example, 500 Å, 1000 Å, or the thickness of the transparent conductive layer and the transparent semiconductor is 300 Å to 3,000 Å, for example, 500 Å, 1000 Å, 2000 Å.

The material of the transparent conductive layer includes indium tin oxide ITO or indium zinc oxide IZO, and the material of the transparent semiconductor layer includes a metal oxide or a silicon material, in which the metal oxide includes indium gallium zinc oxide IGZO or indium tin zinc oxide ITZO.

The step S2 includes:

forming a light shielding layer when a transparent heat conduction layer is formed on the substrate;

S21: sequentially depositing a second buffer layer and an active layer thin film, forming a first active layer and a second active layer on the second buffer layer by a patterning process, a position of the first active layer being corresponding to a position of the light shielding layer;

S22: sequentially depositing a gate insulating thin film and a gate metal thin film, forming a first gate insulating layer and a first gate electrode on the first active layer by patterning process, forming a second gate insulating layer and a second gate electrode on the second active layer;

S23: ion doping a region in which the first active layer is not blocked by the first gate electrode, and ion doping a region in which the second active layer is not blocked by the second gate electrode, so as to form doped regions of the first active layer and the second active layer;

S24: depositing an interlayer insulating thin film, forming via holes by patterning process, the via holes being respectively located in the doped region of the first active layer and the doped region of the second active layer;

S25: depositing a source/drain metal thin film, forming a first source electrode, a first drain electrode, a second source electrode and a second drain electrode by patterning process, the first source electrode and the first drain electrode being respectively connected with the doped region of the first active layer through the via hole, and the second source electrode and the second drain electrode being respectively connected with the doped region of the second active layer through the via hole;

S26: forming a passivation layer covering the first source electrode, the first drain electrode, the second source electrode, and the second drain electrode.

The specific process of forming the array structure layer has been described in detail in the previous embodiments and will not be described herein.

In the fabricating method of the display back plate provided by the embodiment of the present disclosure, by forming a transparent heat conduction layer, the transparent heat conduction layer can not only achieve a balanced heat effect on the driving thin film transistor and the switching thin film transistor during the high temperature process for fabricating the array structure layer, reduce the difference between the heat effects of the driving thin film transistor and the switching thin film transistor, improve the uniformity of the threshold voltage Vth of the driving thin film transistor and the switching thin film transistor, and maximally eliminate the separation of characteristics of the driving thin film transistor and the switching thin film transistor. Also, with a good heat dissipation function, it reduces the thermal stress on the driving thin film transistor and the switching thin film transistor, improves the electrical characteristics of the thin film transistor, and further improves the reliability and yield of the OLED display device. Further, when the transparent heat conduction layer includes a transparent semiconductor layer, the illumination stability can be increased, and the influence of illumination on the electrical characteristics of the two thin film transistors can be eliminated.

Fifth Embodiment

The embodiment of the present disclosure further provides a display device including any display back plate of the foregoing embodiment. The display device may be: an OLED panel, a mobile phone, a tablet computer, a television, a display, a notebook computer, a digital photo frame, a navigator, and the like, or any display product or component.

An embodiment of the present disclosure provides a display back plate and a fabricating method thereof, and a display device. The problem of separating characteristics of the driving thin film transistor and the switching thin film transistor present in the existing OLED display device can be effectively solved by providing a transparent heat conduction layer between the substrate and the array structure layer. Specifically, in the high-temperature process for fabricating the array structure layer, the transparent heat conduction layer may apply a balanced heat effect to two thin film transistors, reduce the difference between heat effects of two thin film transistors, increase uniformity of the threshold voltage Vth of two thin film transistors, minimize separation of characteristics of the driving thin film transistor and the switching thin film transistor, and at the same time, reduce the thermal stress of two thin film transistors during the fabricating process by a good heat dissipation function of the transparent heat conduction layer, so as to ensure electrical properties of these two thin film transistors. Further, the transparent heat conduction layer may also improve the heat dissipation efficiency during the operation of the OLED display device, and improve the working stability and reliability of the OLED display device.

Of course, it is not necessary to achieve all of the above advantages at the same time by implementing any of the products or methods of the present disclosure. Other features and advantages of the present disclosure will be set forth in the following embodiments of the specification, and would become apparent from the embodiments of the specification, or learned by implementing the present disclosure. The objectives and other advantages of the embodiments of the present disclosure can be realized and obtained by the structure particularly pointed out in the description, the claims, and the accompanying drawings.

In the description of the embodiments of the present disclosure, it should be understood that the orientation or positional relationship indicated by the terms "middle", "upper", "lower", "front", "back", "vertical", "horizontal", "top", "bottom", "inside", "outside" and the like is the orientation or positional relationship shown in the drawings, and is merely for the convenience of describing the present disclosure and simplifying the description, rather than indicating or implying that the device or component must have a specific orientation, a specific construction and operation, and thus cannot be construed as limitation of the present disclosure.

In the description of the embodiments of the present disclosure, it should be noted that the terms "installation", "interconnection", and "connection" are to be understood broadly, and may be, for example, a fixed connection or a detachable connection, or an integral connection; may be a mechanical connection or an electrical connection; may be a direct connection, or may be an indirect connection through an intermediate medium, and may be an internal communication between two elements. The specific meanings of the above terms in the present disclosure can be understood in the specific circumstances by those skilled in the art.

The embodiments disclosed in the present disclosure are as described above, but are merely used to facilitate the understanding of the present disclosure, and are not intended to limit the present disclosure. Any modification or variation in the form and details of the implementation may be made by those skilled in the art without departing from the spirit and scope of the disclosure. However, the protection scope of the present disclosure should still be defined by the appended claims.

What is claimed is:

1. A display back plate, comprising:
   a substrate;
   a transparent heat conduction layer disposed on the substrate, the transparent heat conduction layer comprising a transparent conductive layer and a transparent semiconductor layer, wherein a material of the transparent conductive layer comprises indium tin oxide or indium zinc oxide; a material of the transparent semiconductor layer comprises a metal oxide or a silicon material; and the metal oxide comprises indium gallium zinc oxide or indium tin zinc oxide; and
   an array structure layer disposed on the transparent heat conduction layer, the array structure layer comprising:
      a light shielding layer formed on the transparent heat conduction layer, a first thin film transistor, and a second thin film transistor, wherein the light shielding layer is disposed between the transparent heat conduction layer and the first thin film transistor, and not disposed between the transparent heat conduction layer and the second thin film transistor;
      a buffer layer covering the light shielding layer;
      a first active layer and a second active layer formed on the buffer layer, a position of the first active layer corresponding to a position of the light shielding layer;
      a first gate insulating layer and a first gate electrode formed on the first active layer;
      a second gate insulating layer and a second gate electrode formed on the second active layer;
      an interlayer insulating layer covering the first gate electrode and the second gate electrode;
      a first source electrode, a first drain electrode, a second source electrode, and a second drain electrode formed on the interlayer insulating layer, the first source electrode and the first drain electrode respectively being connected with the first active layer through via holes disposed on the interlayer insulating layer, and the second source electrode and the second drain electrode being respectively connected with the second active layer through via holes disposed on the interlayer insulating layer; and
      a passivation layer covering the first source electrode, the first drain electrode, the second source electrode, and the second drain electrode.

2. The display back plate according to claim 1, wherein:
the buffer layer is a second buffer layer; and
the transparent heat conduction layer further comprises a first buffer layer formed on the substrate.

3. The display back plate according to claim 1, wherein the transparent conductive layer has a thickness of 150 Å to 1500 Å, or the transparent semiconductor layer has a thickness of 150 Å to 1500 Å, or the transparent conductive layer and the transparent semiconductor layer have a thickness of 300 Å to 3,000 Å.

4. A display device comprising a display back plate, the display back plate comprising:
a substrate;
a transparent heat conduction layer disposed on the substrate, the transparent heat conduction layer comprising a transparent conductive layer and a transparent semiconductor layer, wherein a material of the transparent conductive layer comprises indium tin oxide or indium zinc oxide; a material of the transparent semiconductor layer comprises a metal oxide or a silicon material; and the metal oxide comprises indium gallium zinc oxide or indium tin zinc oxide; and
an array structure layer disposed on the transparent heat conduction layer, the array structure layer comprising:
a light shielding layer formed on the transparent heat conduction layer, a first thin film transistor, and a second thin film transistor, wherein the light shielding layer is disposed between the transparent heat conduction layer and the first thin film transistor, and not disposed between the transparent heat conduction layer and the second thin film transistor;
a buffer layer covering the light shielding layer;
a first active layer and a second active layer formed on the buffer layer, a position of the first active layer corresponding to a position of the light shielding layer;
a first gate insulating layer and a first gate electrode formed on the first active layer;
a second gate insulating layer and a second gate electrode formed on the second active layer;
an interlayer insulating layer covering the first gate electrode and the second gate electrode;
a first source electrode, a first drain electrode, a second source electrode, and a second drain electrode formed on the interlayer insulating layer, the first source electrode and the first drain electrode respectively being connected with the first active layer through via holes disposed on the interlayer insulating layer, and the second source electrode and the second drain electrode being respectively connected with the second active layer through via holes disposed on the interlayer insulating layer; and
a passivation layer covering the first source electrode, the first drain electrode, the second source electrode, and the second drain electrode.

5. The display device according to claim 4, wherein:
the buffer layer is a second buffer layer; and
the transparent heat conduction layer further comprises a first buffer layer formed on the substrate.

6. The display device according to claim 4, wherein the transparent conductive layer has a thickness of 150 Å to 1500 Å, or the transparent semiconductor layer has a thickness of 150 Å to 1500 Å, or each of the transparent conductive layer and the transparent semiconductor has a thickness of 300 Å to 3,000 Å.

7. A fabricating method for a display back plate, comprising:

forming a transparent heat conduction layer on a substrate, the transparent heat conduction layer comprising a transparent conductive layer and a transparent semiconductor layer, wherein a material of the transparent conductive layer comprises indium tin oxide or indium zinc oxide; a material of the transparent semiconductor layer comprises a metal oxide or a silicon material; and the metal oxide comprises indium gallium zinc oxide or indium tin zinc oxide; and
disposing an array structure layer on the transparent heat conduction layer, wherein the array structure layer comprises a light shielding layer formed on the transparent heat conduction layer, a first thin film transistor, and a second thin film transistor, wherein the light shielding layer is formed between the transparent heat conduction layer and the first thin film transistor, and is not formed between the transparent heat conduction layer and the second thin film transistor;
forming the light shielding layer when the transparent heat conduction layer is formed on the substrate;
depositing a buffer layer on the light shielding layer;
forming a first active layer and a second active layer on the buffer layer through a patterning process, a position of the first active layer corresponding to a position of the light shielding layer;
depositing a gate insulating thin film and a gate metal thin film to form a first gate insulating layer and a first gate electrode on the first active layer through a patterning process;
forming a second gate insulating layer and a second gate electrode on the second active layer;
ion doping a region in which the first active layer is not blocked by the first gate electrode, and ion doping a region in which the second active layer is not blocked by the second gate electrode, so as to form doped regions of the first active layer and the second active layer;
depositing an interlayer insulating thin film and forming via holes through a patterning process, the via holes being respectively located in the doped region of the first active layer and the doped region of the second active layer;
depositing a source/drain metal thin film, and forming a first source electrode, a first drain electrode, a second source electrode, and a second drain electrode through a patterning process, the first source electrode and the first drain electrode being respectively connected with the doped region of the first active layer through the via hole, and the second source electrode and the second drain electrode being respectively connected with the doped region of the second active layer through the via hole; and
forming a passivation layer covering the first source electrode, the first drain electrode, the second source electrode, and the second drain electrode.

8. The fabricating method according to claim 7, wherein:
the buffer layer is a second buffer layer; and
forming the transparent heat conduction layer on the substrate comprises forming at least one of the transparent conductive layer, the transparent semiconductor layer, and a first buffer layer on the substrate.

9. The fabricating method according to claim 7, wherein the transparent conductive layer has a thickness of 150 Å to 1500 Å, or the transparent semiconductor layer has a thickness of 150 Å to 1500 Å, or the transparent conductive layer and the transparent semiconductor layer have a thickness of 300 Å to 3,000 Å.

* * * * *